(12) United States Patent
Shiue et al.

(10) Patent No.: US 6,753,673 B2
(45) Date of Patent: *Jun. 22, 2004

(54) POWER MODULE FOR PROVIDING IMPULSES OF VARIOUS LEVELS BY CHARGING OR DISCHARGING CAPACITORS THEREWITH

(75) Inventors: Lih-Ren Shiue, Hsinchu (TW); Abel Sun, Taipei (TW); Hsing-Chen Chung, Hsinchu (TW); Jen-Chieh Cheng, Hsinchu (TW)

(73) Assignee: Luxon Energy Devices Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/249,258

(22) Filed: Mar. 27, 2003

(65) Prior Publication Data

US 2003/0214270 A1 Nov. 20, 2003

Related U.S. Application Data

(63) Continuation-in-part of application No. 10/063,794, filed on May 14, 2002.

(51) Int. Cl.$^7$ .............................................. H01M 10/46
(52) U.S. Cl. ....................................... 320/117; 320/166
(58) Field of Search ............................... 320/116, 117, 320/118, 119, 166

(56) References Cited

U.S. PATENT DOCUMENTS

| | | | |
|---|---|---|---|
| 4,015,671 A | 4/1977 | Borisov et al. | 173/117 |
| 4,468,826 A | 9/1984 | Moores, Jr. | 7/158 |
| 4,558,391 A | 12/1985 | Ward et al. | 361/155 |
| 4,579,029 A | 4/1986 | Sunaga | 83/364 |
| 4,801,780 A | 1/1989 | Hayes | 219/130.1 |
| 4,986,713 A | 1/1991 | Zoltner et al. | 412/34 |
| 4,991,472 A | 2/1991 | Hollingsworth | 81/464 |
| 5,105,329 A | 4/1992 | Goldner | 361/156 |
| 5,818,186 A | 10/1998 | Camino | 318/434 |
| 6,086,304 A | 7/2000 | Hujishima et al. | 411/443 |
| 6,173,877 B1 | 1/2001 | Wingert | 227/109 |
| 6,225,596 B1 | 5/2001 | Chandler et al. | 219/130 |
| 6,427,559 B2 | 8/2002 | Junkers | 81/57.39 |
| 6,460,627 B1 | 10/2002 | Below et al. | 173/48 |

Primary Examiner—Edward H. Tso
(74) Attorney, Agent, or Firm—Jiang Chyun IP Office

(57) ABSTRACT

Using the combination of batteries and supercapacitors to provide impulse, various all-in-one power tools driven by the impulse are devised. The impulse may be utilized in three ways, namely, to launch an object, to create an impact force, and to form a peak current that can be greater than 100A. While the supercapacitors greatly enhance the power output of the power module, the supercapacitors are disposed in-parallel for charging and switched to series connection for discharging on depressing the triggers of the tools. Therefore, the batteries required to drive the portable power tools can be minimized & reduced, and the circuitry for conducting the parallel-to-series switch is simple and economical. Using interchangeable attachments or accessories, and power module of the invention, one tool body can be applied to many types of work and maintenance at homes and in the fields.

18 Claims, 5 Drawing Sheets

POWER MODULE FOR PROVIDING IMPULSES OF VARIOUS LEVELS BY CHARGING OR DISCHARGING CAPACITORS THEREWITH

CROSS REFERENCE TO RELATED APPLICATIONS

This application is a continuation-in-part of U.S. patent application Ser. No. 10/063,794, filed May 14, 2002, and titled, High Current Pulse Generator. The prior application is incorporated herein by reference.

BACKGROUND OF INVENTION

1. Field of the Invention

The present invention relates to a DC power module. More specifically, this invention relates to a DC power module composed of a DC voltage source and supercapacitors in parallel connection for driving miscellaneous multifunctional tools with interchangeable attachments or accessories for various tasks.

2. Description of the Related Art

In daily living, there are numerous works requiring an overpowering yet brief pulse of force or energy to complete. For example, operations such as to drive nails into wood, to drill holes in masonry, and to ignite the combustion engines of mowers or vehicles all depend on a peak power from a tool at the critical moment when a high torque is demanded. A method of impulse generation is taught in U.S. Pat. No. 5,699,780, issued to Bissonnette, by rapid conversion of potential energy to kinetic energy using an elongated elastomeric bladder and a fluid such as seawater. Spears are catapulted by the foregoing impulse for spearing fish under water. A projectile in the form of nails or staples can also be ejected at an impulse generated by either a DC or an AC power module, for example, the electric nailer powered by batteries as revealed in U.S. Pat. No. 6,173,877, the battery-operated electric stapler as in U.S. Pat. Nos. 4,558,391 and 5,105,329, as well as the binding apparatus of U.S. Pat. Nos. 4,986,713; 5,818,186 and 6,086,304. Generally, the DC power tools have the convenience of no cord attachment and no location limitation, that is, they may be used at places away from the city power outlets, and they do not suffer voltage fluctuations as their AC counterparts often encounter. Furthermore, the DC motor driven impact has a greater stroke than an AC powered motor because, by being directly driven instead of gear driven, a more positive torque from the motor to a striking piston is created for the DC power tools.

Instead of launching an object, the impulse energy generated by a DC power module may be converted to an impact force for carving, chiseling, chopping, clinching, clipping, compressing, crimping, crushing, embossing, piercing, punching, splicing, and striking, etc. Numerous patents and commercial products for the foregoing applications are available, for example, U.S. Pat. Nos. 4,015,671; 4,468,826; 4,579,029; 4,991,472; 6,427,559 and 6,460,627 are all related to battery-operated hand-held tools. In operation, the required forces are directly transmitted from the interaction between pistons and a resilient member (such as spring). In the third type of application, the impulse provided by a DC power module may be directly delivered as a large electric current for welding as disclosed in U.S. Pat. Nos. 4,801,780 and 6,225,596. Using batteries as power source for the welders, light maintenance or urgent repair can be performed outside the availability of city electricity.

Heavy batteries such as lead-acid (Pb—$H_2SO_4$), environmentally hazardous batteries such as nickel-cadmium (Ni—Cd), or batteries with some memory-effect such as nickel-metal hydride (Ni-MH) are universally employed in the prior art of portable power tools driven by impulse energy. In order to provide sufficient impulse, the batteries are often in large sizes and in multiple numbers that makes the tools bulky and heavy. The electronic circuits for generating the required impulse are also complex making the tools expensive. Though the foregoing batteries are rechargeable, more often than not the batteries are too low in energy content to serve at the time of emergency. Then, the users have to wait several hours for charging the batteries for a work that may only take a few minutes to finish.

SUMMARY OF INVENTION

The present invention provides a DC power module that can be custom made to deliver the desired impulse energy using a minimal amount of batteries and supercapacitors, as well as a simple electronic architecture. Furthermore, primary cells such as alkaline batteries, may be employed for the proposed power module. Power tools using the power module of the invention are compact, light, economical, and ready-to-go at all times. Using the power module of the invention in conjunction with interchangeable attachments or accessories, multi-purpose portable hand tools driven by impulse energy can be devised for various types of works.

Based on the energy conversion, the portable tools that are driven by impulse can be divided into three categories:

1. Tools utilize the impulse and mechanical components to launch an object such as nail, staple, or pin for fastening or binding;
2. Tools utilize the impulse and mechanical components to provide an impact force for scraping, hammering, punching, embossing, chopping, chiseling, piercing, splicing or clipping; and
3. Tools utilize the impulse directly to deliver a surge of electricity or a peak current for starting engines, for welding metals, or for actuating machineries.

It is an object of this invention to devise a method for generating the required impulse energy for conveniently and economically performing the above operations of work or maintenance. Though the aforementioned works demand a wide range of power, all of the power needs can be fulfilled by a universal power module that consists of supercapacitors and batteries connected in parallel through a control circuit.

Supercapacitors, also know as ultracapacitors and electric double layer capacitors, are accumulators of a large quantity of static charge up to thousands of farads in a single container of small volume. Essentially, all of the charge stored in supercapacitors can be discharged at once leading to an immense current that is useful to drive many power tools. Since the supercapacitors are light and compact, the tools operated on the capacitors are truly portable. Furthermore, supercapacitors can be fabricated in various configurations at low cost, the capacitors therefore are a better device than the frequently used step-up converters, inductors or fly wheels for boosting the power output of batteries. Due to the extraordinarily high power density of supercapacitors, the power output of any DC voltage sources, even the low-power device such as the primary batteries, can be augmented by tens of folds by the supercapacitors. In the power module of the present invention, the batteries serve as the charging source for supercapacitors, while an electronic controller will regulate the level of power output of supercapacitors via pulse width modulation (PWM). For attaining a long service time, the batteries are arranged to always discharge at a low rate, that is, the batteries will take care all of the low-power demands, whereas the supercapacitors provide the extra power need that cannot be offered by the batteries. By releasing the batteries from providing large power outputs, the voltage drop of batteries is minimized and their use-time is prolonged.

Theoretically, in order to fully charge the supercapacitors, the batteries should possess an identical or comparable voltage as that of the capacitors. Often many batteries have to be placed in series to match the target of charging voltage. As the number of batteries is increased, the power module for the tools become bulky and expensive. The present invention imposes individual supercapacitors or supercapacitor packs in parallel connection for charging. Then, all supercapacitors are momentarily switched to series connection for discharge when an impulse is requested. By charging supercapacitors in parallel, the number and size of charging batteries may be reduced. Whereas the supercapacitors discharge through a series connection, the capacitors can impart an impulse of twice the voltage of that of the parallel configuration to the portable tools. Only a trigger and an electromeganetic relay are needed to momentarily convert the supercapacitors from parallel configuration to series formation. Not only is the electronic control architecture simple and economical, but there is virtually no energy loss at the power amplification of batteries.

For all three types of application of electric impulse, one tool body with interchangeable attachments or accessories, and the power module of the present invention, may become the required all-in-one tools. In some cases, the interchangeable attachments can be handily integrated with the tool body as described in the present invention. In other cases, the interchangeable accessories may be provided in a supplementary kit accompanying with the tool body for various works.

These and other objectives, features as well as advantages in accordance with the present invention will become apparent from the following detailed description, and from preferred embodiments with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Hand-held devices of electronics and non-electronics are becoming popular and important in our daily life. Not only should the devices be compact and light for easy carry, also they should have more than one function for multiple applications. For example, some mobile phones now weigh less than 100 g, and in addition to voice communication they have access to internet; further, they can also take photos as a DSC (digital still camera) with the capability of instantaneous transmission of photos through the web. As the dimension of portable devices become smaller, and as more options are added, the burden on the batteries that power the devices is heavier than ever. To cope with the inevitable modernization of the portable devices, both energy and power densities of batteries have been continuously and industriously improved. Nevertheless, the progress of battery evolution is always less than satisfaction. Thus, many energy conservation techniques such as low power-consumption processors, automatic sensors, and stand-by mode systems are devised to compensate the deficiency of batteries. From the perspectives of fabrication, installation and implementation, supercapacitors are one perfect electronic component for managing the energy operation of batteries. At the charging of supercapacitors, supercapacitors may serve as an energy buffer or an energy equalizer, while at the discharging of supercapacitors, the capacitors may work as a power amplifier. The present invention utilizes supercapacitors to amplify the power output of batteries for driving various power tools without using a converter, a transformer, a function generator or an oscillating RLC circuit.

Figure 1A:
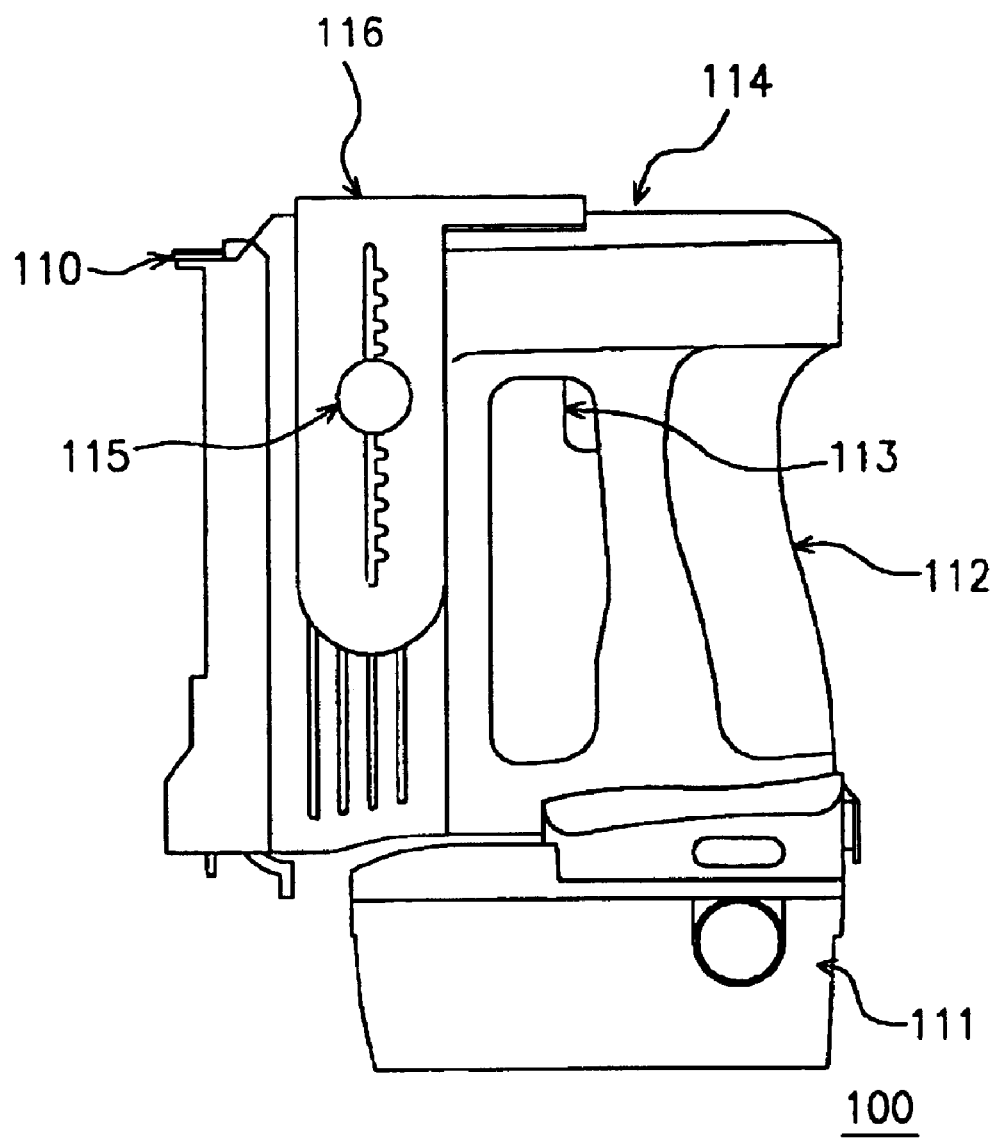
FIG. 1A is a side view of an electric nailer in accordance with the present invention.
Figure 1B:
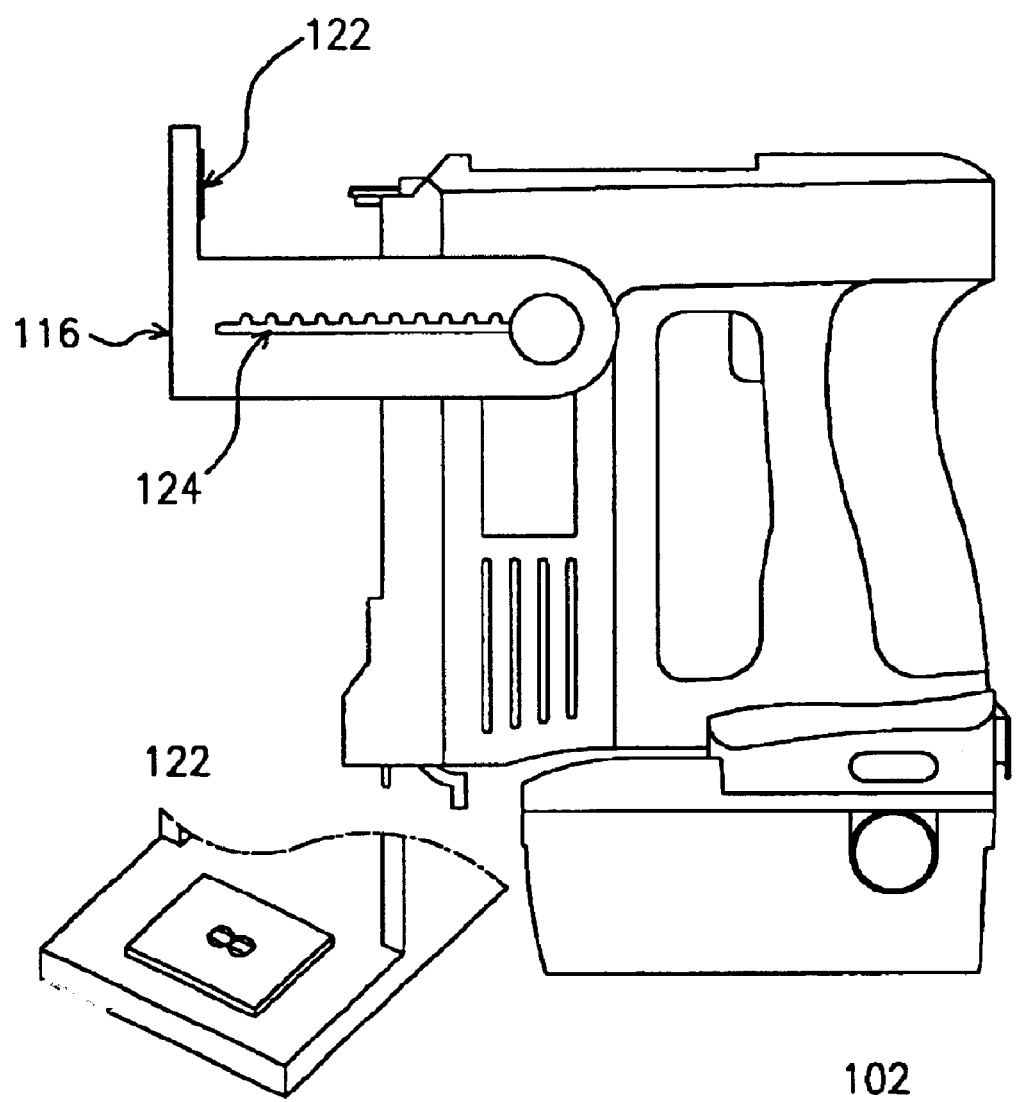
FIG. 1B is a side view of an electric stapler of the inventive power tool.

FIG. 1A shows a first embodiment of the present invention of an electric nailer 100 that is operated on an impulse energy, which is provided by a power module consisting of batteries and supercapacitors, to launch a nail or pin of various sizes for fastening. An object such as a nail or a pin will be ejected from the ejection port 110 of the nailer 100 upon depressing trigger 113, which causes the discharge of power module disposed inside the detachable compartment 111. Handle 112 provides easy grip and maneuver of the electric nailer 100 to the operators, while tool body 114 contains a number of mechanical components such as motor, gears and spring (not shown in FIG. 1A). Using the impulse energy from the power module, the motor will drive or squeeze the spring to the maximum position. As the spring rebounds to its original length, it will instantaneously strike a nail or a pin from a magazine and out of the nailer 100 at the port 110 to perform fastening. In addition, there is an attachment 116 with an adjusting screw 115 installed on top of the tool body 114 for conducting other function than fastening. As shown in FIG. 1B, by unscrewing and resetting the screw 115, the attachment 116 can be placed and secured at a position where the clinching anvil 122 is aligned with the ejection port 110, and an electric stapler 102 is formed. On depressing the trigger 113, a U-shape staple can be ejected out of the stapler 102 and through a stack of paper placed between 110 and 122 for binding (not shown in FIG. 1B). After the staple is driven through successive sheets of paper, it will be stopped in the groves of anvil 122 wherein both ends of the U-shape staple is folded against the last page of the stack to complete the binding operation. FIG. 1B also shows a number of slots 124 on the interchangeable attachment 116 designed for adjusting the gap between 110 and 122 in corresponding to the thickness of multiple paper sheets in the stack to be bound. Both nailer 100 and stapler 102 not only share the same tool body 114 and the power source installed inside the compartment 111, but also nails, pins, and staples can travel through the same trajectory barrel. The nailer 100 and the stapler 102 are interchangeable via the attachment 116, one tool can thus perform two functions.

Figure 2:
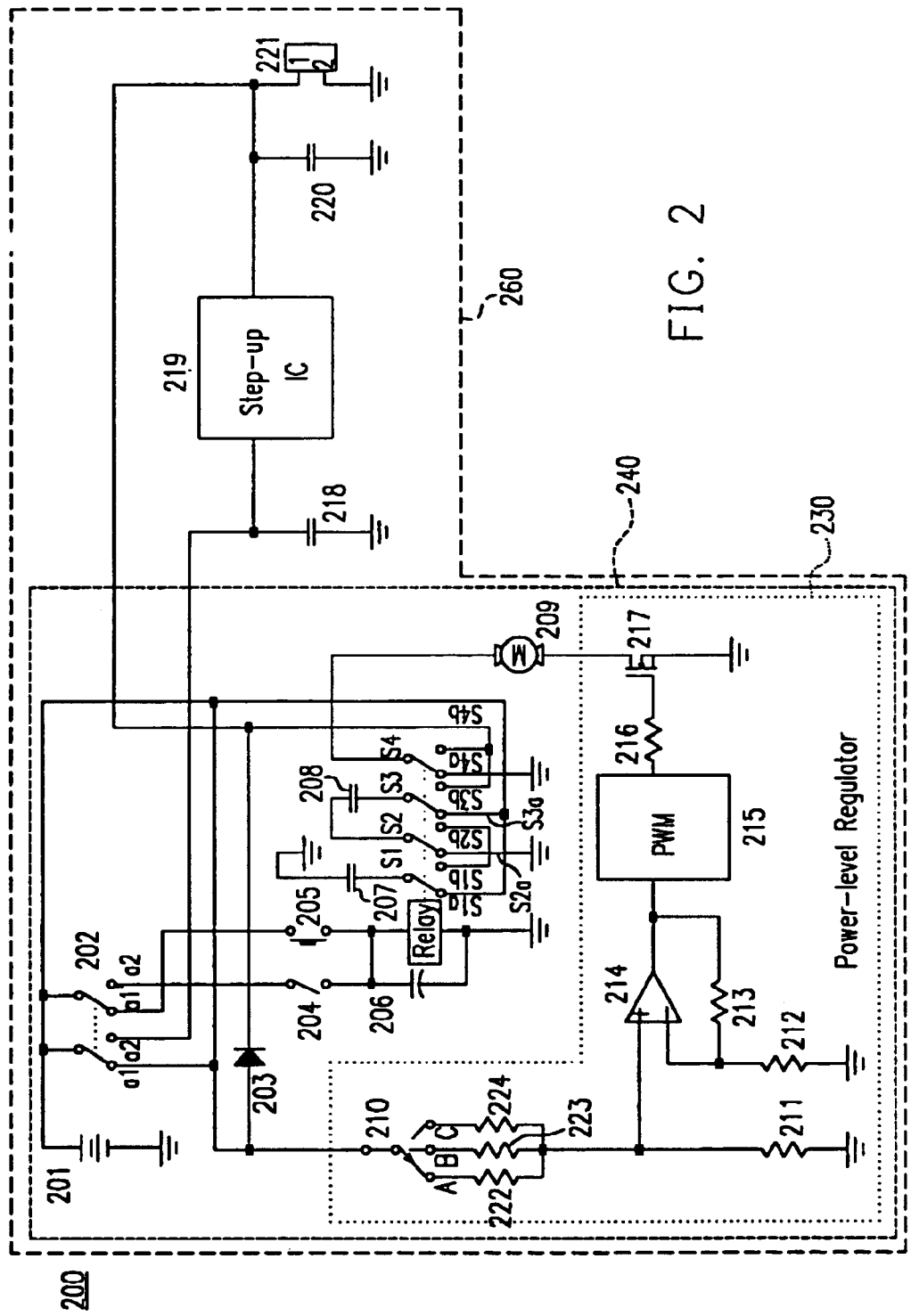
FIG. 2 is a schematic diagram illustrating the impulse generating module and circuitry consisting of a DC voltage source, supercapacitors, and an electronic controller.
Figure 3A:
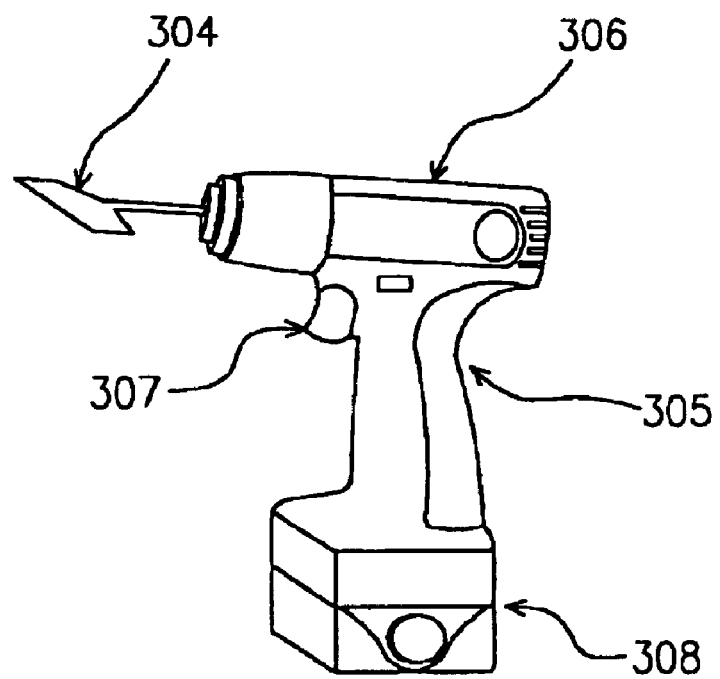
FIGS. 3A, 3B, 3C, and 3D are side views of one hand-held body with interchangeable accessories for performing scarping, hammering, embossing, and punching, respectively.
Figure 3B:
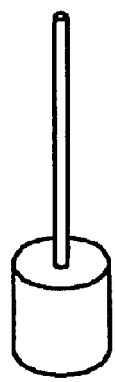
Figure 3C:
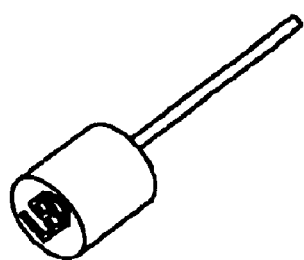
Figure 3D:
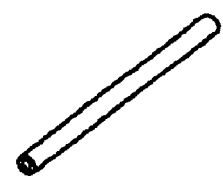
Figure 4A:
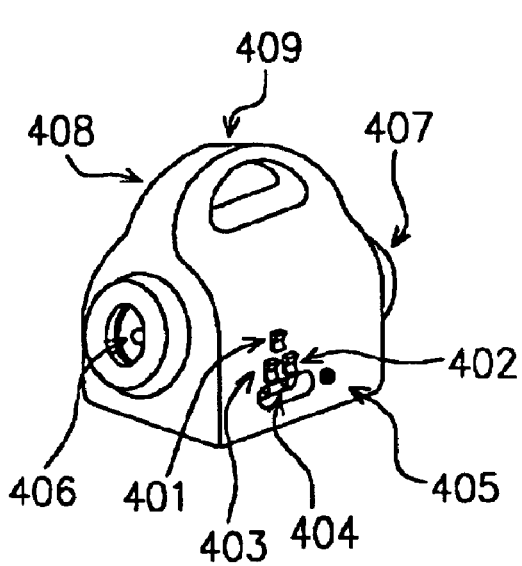
FIGS. 4A, 4B, 4C, and 4D are schematic views of one portable power supply (4A) and its interchangeable accessories for starting combustion engines (4B), for spot welding (4C), and for soldering (4D), respectively.
Figure 4C:
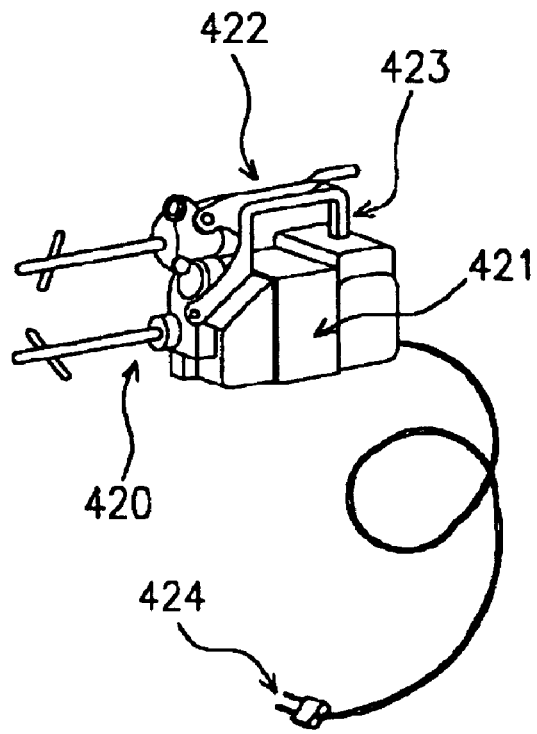
Figure 4B:
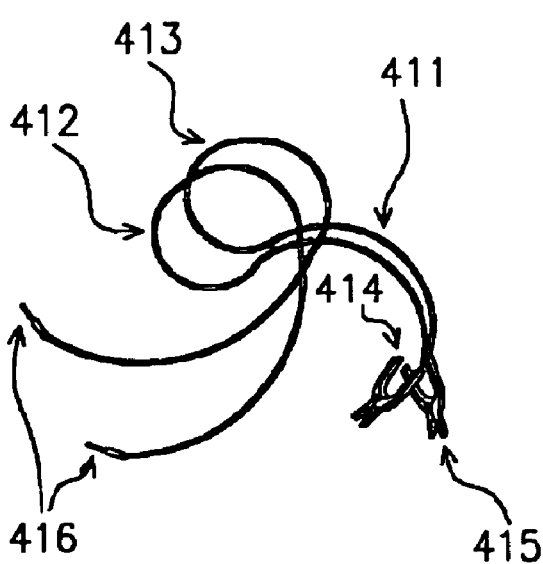
Figure 4D:
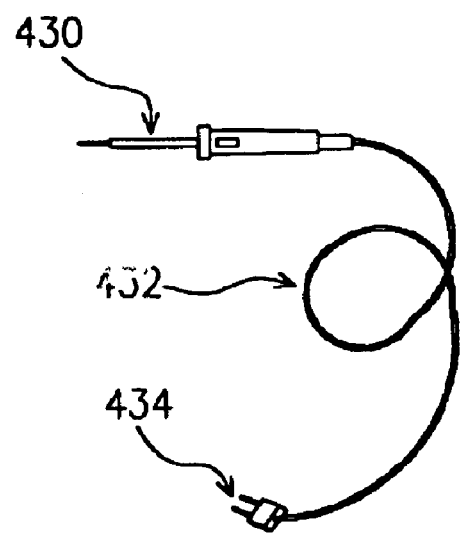

FIG. 2 is a preferred embodiment of the present invention on the power module 200 for generating an electric impulse capable of diving power tools to launch an object, to form an impact force, and to deliver peak currents. Block 240 of FIG. 2 is designed for instantaneously driving the aforementioned nailer 100 or stapler 102, while block 260 is for imparting large currents to heavy loads. Nevertheless, supercapacitors 207 and 208, as well as relay (S1–S4) are shared by blocks 240 and 260. The supercapacitors 207 and 208, also know as ultracapacitors and electric double layer capacitors, are accumulators of a large quantity of static charge up to thousands of farads in a single container of small volume. There is a power-level regulator within block 240 and 260 for choosing a power output to accommodate the work loads. By setting the switch 202 at a1 and a1", block 240 is utilized and a DC voltage source 201 will charge supercapacitor 207 through contacts S1a and S1, also charge supercapacitor 208 via contacts S3a and S3. Diode 203 is to prevent back-flow of current from the supercapacitors 207 and 208 to the DC voltage source 201. The aforementioned contacts (S1, S1a, S3, and S3a) are four members of 12 contacts of a 4-port electromagnetic relay with S1 to S4 as common points. In addition, each port of the relay has a single-pole, double-throw (SPDT) with four sets of the 12 contacts are normally closed (S1–S1a, S2–S2a, S3–S3a, and S4–S4a), while the other four sets are normally open (S1–S1b, S2–S2b, S3–S3b, and S4–S4b). During charging, the equal-potential capacitors 207 and 208 are connected in-parallel, thus the DC voltage source 201 may have a working voltage slightly larger than that of the capacitors, but the DC voltage source 201 may have a voltage much lower than the driving voltage of motor 209 of the impulse-driven tools. As a result, both the size and quantity of battery 201 can be reduced. When the trigger 205 of the tools is depressed, the relay will be switched from normally closed to normally open. Thence, the capacitors 207 and 208 will discharge in-series-connection to the motor 209, and the motor will receive an electric impulse of twice the voltage of either capacitor. After discharge, the supercapacitors will return to the parallel connection for charging. If the tools are used for maintenance and works of different power demands, the power-level selector 210 may fulfill the needs. There are three power levels, A, B and C, for selecting low, medium and high power outputs, respectively. The power level is determined by the resistance of the resistors 222, 223 and 224, whereby the lower the resistance is, the higher the power level will be. When the switch 202 is at a1 and a1", the DC voltage source 201 will provide its voltage to the selector 210 through point a1. After the battery voltage is divided by the corresponding resistor 222, 223, or 224 and the resistor 211, a partial voltage is supplied to the non-inverting input of the differential amplifier 214. Next, by comparing the partial voltage to the internal reference voltage at the inverting input of amplifier 214, a differential voltage being amplified by a factor of the ratio between the resistances of the resistors 213 and 212 is produced as the output of 214. Subsequently, the output of 214 becomes an input voltage to the pulse width modulator (PWM) 215. Depending on whether the level A, B or C is selected, the input voltage for 215 will be correspondingly low, medium, and high, and the resulting pulse widths generated by the PWM 215 will be narrow, medium, and wide, respectively. Following the signals from the PWM 215, the open time of the N-channel field effect transistor (FET) 217, the gate terminal of which is electrically coupled to the PWM 215, is decided by the triggering pulse width issued by the PWM 215. In other words, narrow, medium and wide pulse widths of 215 will cause short, medium and long open times, respectively, of FET 217. Finally, the open time of FET 217 will decide the motor 209 to receive a low, medium or high level of impulse. The power level control as described above may protect materials such as paper sheets from damage by excessive force.

If the switch 202 of FIG. 2 is placed at a2 and a2", block 260 will be in use. Charging and discharging of supercapacitors 207 and 208 for block 260 are identical to that of block 240 as described above, except a switch 204 is depressed instead of the trigger 205 for driving the relay (S1–S4) and a step-up IC 219 is electrically coupled to the DC voltage source 201 and connected in parallel with the supercapacitors 207 and 208 in the mode where the supercapacitors 207 and 208 are switched into series connection via the relay (S1–S3) for discharging. The step-up IC 219 is employed in block 260 to boost the voltage supplied by the DC voltage source 201 ensuring the output power always at a potential level above the driving voltage of the load electrically coupled to the connector 221 before the operation is completed. Such supplementary power-amplification of DC voltage source 201 by step-up IC 219 serves as a backup to the supercapacitors to compensate their fast voltage drop during discharge. No matter how insignificant the power compensation is in comparison to the power output of supercapacitors, the supplemental energy may make a difference on energizing an especially heavy load such as to start the engine of an extensively idled automobile. The DC voltage source 201 can be, for example, primary battery, secondary battery, fuel cells, metal-air cells, solar cells, wind cells, or rectified AC power whether they are suitable for charging the supercapacitors 207 and 208. In addition to the electromagnetic relay, a solid state relay (SSR) or a solenoid is applicable to the switching of supercapacitors as well. Furthermore, the service time and power rating of the module 200 can be custom made to meet the application requirements. By a meticulous balance between the batteries and supercapacitors incorporated in the power module 200, the module is easy to offer a specific power density well above 1 KW/Kg in compact sizes. Another salient feature of the present invention is that the DC voltage source 201 is always kept to discharge at a low potential level to minimize its voltage drop and to prolong its use-time, while the supercapacitors 207 and 208 are designated to supply the large power outputs that are otherwise unattainable from the DC voltage source 201.

FIG. 3 shows schematic views of an impulse-driven tool and interchangeable accessories thereof in accordance with a second embodiment of the present invention. The impulse-driven tool utilizes the electric impulse provided by the power module 200 of FIG. 2 to impart an impact force for various applications. Using interchangeable accessories, a single tool body 306 equipped with handle 305, trigger 307, and a detachable compartment 308 that contains the power module 200 may perform as many tasks as the interchangeable accessories are available for use. For example, a spade-head accessory 304 is secured by means of a set crew or other mechanisms on the driving head of tool body 306, an electric scraper 3A is formed for removing various residues from many kinds of surface. Replacing 304 with a hammering accessory 3B, an electric hammer is assembled for crushing stones, or for cracking cements. Similarly, an embossing accessory with LED inscription as shown in FIG. 3C may be used in corporation with the tool body 306 to construct an electric embosser for registering the letters on the surface of woods, plastics, or metals. FIG. 3D shows a piercing accessory that may be used to build an electric puncher with piercing power controllable by the power module 200 of FIG. 2. Clearly, as long as an accessory is operable on impact force and it can be locked on a tool body such as 306, then the power module inside the compartment 308 will support the accessory to perform its intended function, and a multi-purpose power tool is created.

FIG. 4 shows schematic views of a portable power supply and interchangeable accessories thereof in accordance with a third embodiment of the present invention. The portable power supply as shown in FIG. 4A can supply peak currents utilizing the electric energy provided by the power module 200 of FIG. 2. The portable power supply has a housing 408 that contains the power module 200, a flash light bulb 406 on one end, and an emergency light bulb 407 on the other. Options other than illumination or signal can be installed on the power supply 4A. On the surface of housing 408, there is a handle 409 for easy carry, three switches 401, 402, 403 wherein the switch 401 is the on/off control of the power module 200, the switch 403 for choosing illumination 406 or signal 407, and the switch 402 is another power on/off control for actuating the functional block 260 of FIG. 2, so that peak currents are available for heavy loads such as FIGS. 4B to 4D. Also, there are two sockets 404 and 405 on the surface of housing 408. The socket 404 is the outlet of peak currents provided by the power module 200, while the socket 405 allows the connection to an external power source for charging the DC voltage source 201 of the power module 200. FIG. 4B shows a car-battery jumper 411 consisting of two jumping cables 412 and 413 with male connectors 416 on one end for plugging into socket 404 to receive peak currents, and two alligator clamps 414 and 415 on the other end for connecting to the plus and negative terminals of a car battery, respectively. As the ignition key of car is turned, so the switch 204 of FIG. 2 is depressed, the power module 200 will provide a power with sufficient voltage and current to initiate and sustain spark ignition during cranking of the startor of combustion engine. Next, FIG. 4C shows an electric welder accessory that can attain peak currents from the portable power supply as shown in FIG. 4A via the plug 424 to energize a time and current controlling circuit installed inside the compartment 421 when the trigger 422 is actuated by a hand holding the handle 423. As the trigger 422 is operated intermittently, peak current pulses are supplied to the tips of electrodes 420 to cause local fusion for spot welding. Similarly, FIG. 4D shows a soldering gun accessory 430 that can attain peak currents from the portable power supply as shown in FIG. 4A via cable 432 and plug 434 to melt solders for constructing electronic connections in the laboratory or in the field. In conclusion, equipped with interchangeable accessories as shown in FIGS. 4B, 4C and 4D, the portable power supply as shown in FIG. 4A can become a portable battery jumper, a portable spot welder, and a portable soldering iron, respectively. There is almost no limitation to the capability of the portable power supply, so long as a suitable accessory is available for attaching to the power outlet of the portable power supply. The power rating, as well as the service time, of the portable power supply is tunable by adjusting the energy capacities of both batteries and supercapacitors.

An example for a power module is described in the following statement. A power module with the architecture 200 of FIG. 2 is constructed by incorporating lithium ion batteries and supercapacitors as the power module. There are 8 pieces of 18650 (18 mm diameter and 65 mm long) Li batteries, each of which has a rated voltage of 3.7 V and rated capacity of 2000 mAh as well as comparable internal resistances, in 2S4P configuration. That is, every two batteries are first connected in series, the four sets are then connected in parallel to form a battery pack of 7.4 V and 8000 mAh. In contrast, 6 pieces of supercapacitors, each of which has a capacity of 2.5 V×200 F and a dimension of 50 mm diameter by 75 mm long, are grouped in two packs comprised of three supercapacitors connected in series per pack. The two supercapacitor packs are connected in parallel for charging, however, all capacitors are momentarily switched to series connection for discharging. Using the module and accessory as FIG. 4B, peak currents are provided to start cars of 2000 cc and 3000 cc engine volumes, and the peak currents are measured at 180 A and 240 A, respectively. Duration of the peak currents ranges from 100 ms to 500 ms. At the same voltage as the conventional car battery, that is, 12 V, the power module of the example can at least supply powers from 2.16 KW to 2.88 KW. Such large powers are unattainable from a Li battery pack of 8000 mAh. A current output of 240 A is equivalent to 30 C discharge rate of the 8000 mAh battery pack, which will cause catastrophic results if the Li ion batteries do discharge at such rate. Incidentally, the power module as constructed and its housing together weigh 1.5 Kg, and the housing has a volume of 5280 ml (150 mm×160 mm×220 mm).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power module comprising:
   a DC voltage source;
   a switching element electrically coupled to the DC voltage source;
   a plurality of capacitors electrically coupled to the switching element, the capacitors arranged in parallel connection for charging, the capacitors switched into series connection via the switching element for discharging;
   a switch electrically coupled to the switching element for switching the switching element; and
   a step-up IC electrically coupled to the DC voltage source and connected in parallel with the capacitors in the mode where the capacitors are switched into series connection via the switching element for discharging.

2. A power module in accordance with claim 1, further comprising a power-level regulator electrically coupled to the DC voltage source for controlling the power level of the output from the power module.

3. A power module in accordance with claim 2, wherein the power-level regulator comprises:
   a plurality of resistors, one of which is switched to be electrically coupled to the DC voltage source;
   a pulse width modulator electrically coupled to the resistors, the output of the pulse width modulator controlled by switching one of the resistors to be electrically coupled to the DC voltage source; and
   a transistor, a gate terminal of which is electrically coupled to the pulse width modulator for deciding the open time of the transistor and controlling the output from the power module by the output of the pulse width modulator.

4. A power module in accordance with claim 1, wherein said DC voltage source is selected from a group consisting of primary batteries, secondary batteries, fuel cells, metal-air batteries, solar cells, wind cells, and rectified AC power.

5. A power module in accordance with claim 1, wherein said switching element is selected from a group consisting of electromagnetic relay, solid state relay, and solenoid.

6. A power module in accordance with claim 1, wherein the capacitors are selected from a group consisting of supercapacitors, ultracapacitors and electric double layer capacitors.

7. A power module comprising:

a DC voltage source;

a switching element electrically coupled to the DC voltage source;

a plurality of capacitors electrically coupled to the switching element, via which the capacitors are switched into parallel connection for charging or into series connection for discharging; and a switch electrically coupled to the switching element for switching the switching element.

8. A power module in accordance with claim 7, further comprising a power-level regulator electrically coupled to the DC voltage source for controlling the power level of the output from the power module.

9. A power module in accordance with claim 8, wherein the power-level regulator comprises:

a plurality of resistors, one of which is switched to be electrically coupled to the DC voltage source;

a pulse width modulator electrically coupled to the resistors, the output of the pulse width modulator controlled by switching one of the resistors to be electrically coupled to the DC voltage source; and a transistor, a gate terminal of which is electrically coupled to the pulse width modulator for deciding the open time of the transistor and controlling the output from the power module by the output of the pulse width modulator.

10. A power module in accordance with claim 7, wherein said DC voltage source is selected from a group consisting of primary batteries, secondary batteries, fuel cells, metal-air batteries, solar cells, wind cells, and rectified AC power.

11. A power module in accordance with claim 7, wherein said switching element is selected from a group consisting of electromagnetic relay, solid state relay, and solenoid.

12. A power module in accordance with claim 7, wherein the capacitors are selected from a group consisting of supercapacitors, ultracapacitors and electric double layer capacitors.

13. A power module comprising:

a DC voltage source;

a first switching element electrically coupled to the DC voltage source;

a second switching element electrically coupled to the DC voltage source;

a plurality of capacitors electrically coupled to the first switching element, the capacitors arranged in parallel connection for charging, the capacitors switched into series connection via the first switching element for discharging;

a first switch electrically coupled between the first switching element and the second switching element;

a second switch electrically coupled between the first switching element and the second switching element; and a step-up IC electrically coupled to the second switching element, wherein the power module is switched into a first mode or a second mode by switching the second switching element, in the first mode where the step-up IC is electrically coupled to the DC voltage source and connected in parallel with the capacitors in the mode where the capacitors are switched into series connection via the first switching element for discharging and the first switch is electrically coupled to the DC voltage via the second switching element for switching the first switching element while the second switch is electrically disconnected from the DC voltage source, in the second mode where the step-up IC is electrically disconnected from the DC voltage source and the second switch is electrically coupled to the DC voltage via the second switching element for switching the first switching element while the first switch is electrically disconnected from the DC voltage source.

14. A power module in accordance with claim 13, further comprising a power-level regulator electrically coupled to the DC voltage source for controlling the power level of the output from the power module.

15. A power module in accordance with claim 14, wherein the power-level regulator comprises:

a plurality of resistors, one of which is switched to be electrically coupled to the DC voltage source;

a pulse width modulator electrically coupled to the resistors, the output of the pulse width modulator controlled by switching one of the resistors to be electrically coupled to the DC voltage source; and a transistor, a gate terminal of which is electrically coupled to the pulse width modulator for deciding the open time of the transistor and controlling the output from the power module by the output of the pulse width modulator.

16. A power module in accordance with claim 13, wherein said DC voltage source is selected from a group consisting of primary batteries, secondary batteries, fuel cells, metal-air batteries, solar cells, wind cells, and rectified AC power.

17. A power module in accordance with claim 13, wherein said first switching element is selected from a group consisting of electromagnetic relay, solid state relay, and solenoid.

18. A power module in accordance with claim 13, wherein the capacitors are selected from a group consisting of supercapacitors, ultracapacitors and electric double layer capacitors.

* * * * *